(12) United States Patent
Yu et al.

(10) Patent No.: US 11,317,521 B2
(45) Date of Patent: Apr. 26, 2022

(54) RESIN FLOW RESTRICTION PROCESS AND STRUCTURE

(71) Applicant: Multek Technologies Limited, Irvine, CA (US)

(72) Inventors: Pui Yin Yu, Hong Kong (CN); Hong Tu Zhang, Zhuhai (CN); Xin Hua Zeng, Zhuhai (CN)

( * ) Notice: Subject to any disclaimer, the term of this patent is extended or adjusted under 35 U.S.C. 154(b) by 15 days.

(21) Appl. No.: 16/946,712

(22) Filed: Jul. 1, 2020

(65) Prior Publication Data

US 2021/0385952 A1 Dec. 9, 2021

(30) Foreign Application Priority Data

Jun. 9, 2020 (CN) .......................... 202010518818.8

(51) Int. Cl.
*H05K 3/46* (2006.01)
*H05K 1/09* (2006.01)

(52) U.S. Cl.
CPC ............. *H05K 3/4644* (2013.01); *H05K 1/09* (2013.01)

(58) Field of Classification Search
CPC ........... H05K 3/46; H05K 3/4644; H05K 1/09
USPC ........................................................ 174/257
See application file for complete search history.

(56) References Cited

U.S. PATENT DOCUMENTS

2020/0163206 A1* 5/2020 Tuominen ............ H05K 1/0373

* cited by examiner

*Primary Examiner* — Tremesha S Willis
(74) *Attorney, Agent, or Firm* — Carlson, Caspers, Vandenburgh & Lindquist, P.A.

(57) ABSTRACT

A printed circuit board includes a first and second core. The first core has a first conductive layer, a first non-conductive layer, a first copper layer and a first opening. The first core also has a first solder mask connected to the first copper layer and a first FR4 laminate bonded to the first solder mask. The second core has a second conductive layer, a second non-conductive layer, a second copper layer and a second opening. The second core also has a second solder mask connected to the second copper layer and a second FR4 laminate bonded to the second solder mask. A prepreg layer is between the first copper layer and the second copper layer but not between the first FR4 laminate and the second FR4 laminate.

20 Claims, 9 Drawing Sheets

RESIN FLOW RESTRICTION PROCESS AND STRUCTURE

RELATED APPLICATIONS

This application claims the benefit of Chinese Patent Application No. 20201058818.8 filed on Jun. 9, 2020, entitled "RESIN FLOW RESTRICTION PROCESS AND STRUCTURE", which is hereby incorporated herein by reference.

FIELD OF THE DISCLOSURE

The present application relates generally to printed circuit boards, and more particularly to a resin flow restriction process and structure.

BACKGROUND

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrates. Conductors on different layers are interconnected with plated-through holes called vias.

A PCB includes a plurality of stacked layers, the layers are made of alternating non-conductive layers and conductive layers. The non-conductive layers can be made of prepreg or base material, that is part of a core structure, or simply core. Prepreg is a fibrous reinforcement material impregnated or coated with a resin binder and consolidated and partially cured to an intermediate stage semi-solid product. Prepreg is used as an adhesive layer to bond discrete layers of multiplayer PCB construction, where a multilayer PCB consists of alternative layers of conductors and base materials bonded together, including at least one internal conductive layer. A base material is a fully cured organic or inorganic material used to support a pattern of conductor material. A core is a metal clad base material where the base material has integral metal conductor material on one or both sides. A laminated stack is formed by stacking multiple core structures with intervening prepreg and then laminating the stack to fully cure the prepreg and bond the adjacent layers together. A via can then be formed by drilling a hole through the laminated stack and plating the wall of the hole with electrically conductive material, such as copper. The resulting plating interconnects the conductive layers in the laminated stack.

In conductive paste connected PCBs, cores are prepared separately and then electrically connected by conductive past and bonded together by prepreg through a lamination cycle. For pin insertion or component surface mount technology ("SMT"), there must be a resin free opening. To create a resin free opening in sequential lamination, it is common to use pre-cut low or no flow prepreg and control the resin flow as it is related to prepreg thickness, resin content, lamination pressure and lamination temperature. Due to design restrictions, the opening must be prepared in some cores. Therefore, improvements are desirable.

SUMMARY

In a first aspect of the present invention, a printed circuit board includes a first and second core. The first core has a first conductive layer, a first non-conductive layer, a first copper layer and a first opening. The first core also has a first solder mask connected to the first copper layer and a first FR4 laminate bonded to the first solder mask. The second core has a second conductive layer, a second non-conductive layer, a second copper layer and a second opening. The second core also has a second solder mask connected to the second copper layer and a second FR4 laminate bonded to the second solder mask. A prepreg layer is between the first copper layer and the second copper layer but not between the first FR4 laminate and the second FR4 laminate.

In a second aspect of the present invention, a method of manufacturing a printed circuit board includes adding a first solder mask to a first copper layer of a first core having a first opening; bonding a first FR4 laminate to the first solder mask; adding a second solder mask to a second copper layer of a second core having a second opening; bonding a second FR4 laminate to the second solder mask; mating the first core to the second core such that the first FR4 laminate is opposite the second FR4 laminate and the first opening and the second opening line up; adding a prepreg resin between the first copper layer and the second copper layer but not between the first FR4 laminate and the second FR4 laminate; and laminating the first core to the second core, wherein the first FR4 laminate and the second FR4 laminate reduce the prepreg resin flowing into the first and second openings.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE FIGURES

For a more complete understanding of the disclosed system and methods, reference is now made to the following descriptions taken in conjunction with the accompanying drawings.

DETAILED DESCRIPTION

Embodiments of the present application are directed to a printed circuit board. Those of ordinary skill in the art will recognize that the following detailed description of the printed circuit board is illustrative only and is not intended to be in any way limiting. Other embodiments of the printed circuit board will readily suggest themselves to such skilled persons having the benefit of this disclosure.

In general, the present invention is directed to a resin flow restriction process and structure. A new process flow is developed that enables standard flow prepreg to be used without limitation on prepreg thickness, resin content and lamination setting. An opening can be created in cores prior to assembly of the cores into the final PCB. In a first core, a solder mask ("SM") frame around an opening is exposed and developed without final curing. A FR4 bare laminate is fast laminated to this SM frame. FR4 is a general designation for a matrix of fiberglass and epoxy. Since the SM frame is not finally cured, under fast lamination pressure and temperature, it bonds to FR4 bare laminate strongly. The outline of the FR4 laminate is then cut by laser to the correct size. The laminate thickness is selected based on a desired end bonding prepreg thickness.

The SM frame/FR4 laminate fast lamination and laser cut can be mirrored on a second core such that the total thickness of FR4 laminate is minimum 10 um thicker than the end bonding prepreg thickness desired. The bonding prepreg is pre-cut with an opening larger than the FR4 laminate outline. During the lamination process, the SM/FR4/FR4/SM (from the first and second cores) are under high pressure and pressed tightly together so that bonding prepreg resin cannot penetrate to the opening. In other words, the SM/FR4/FR4/SM structure blocks the opening to the the prepreg resin, reducing the prepreg resin that flows into the opening.

Figure 1:
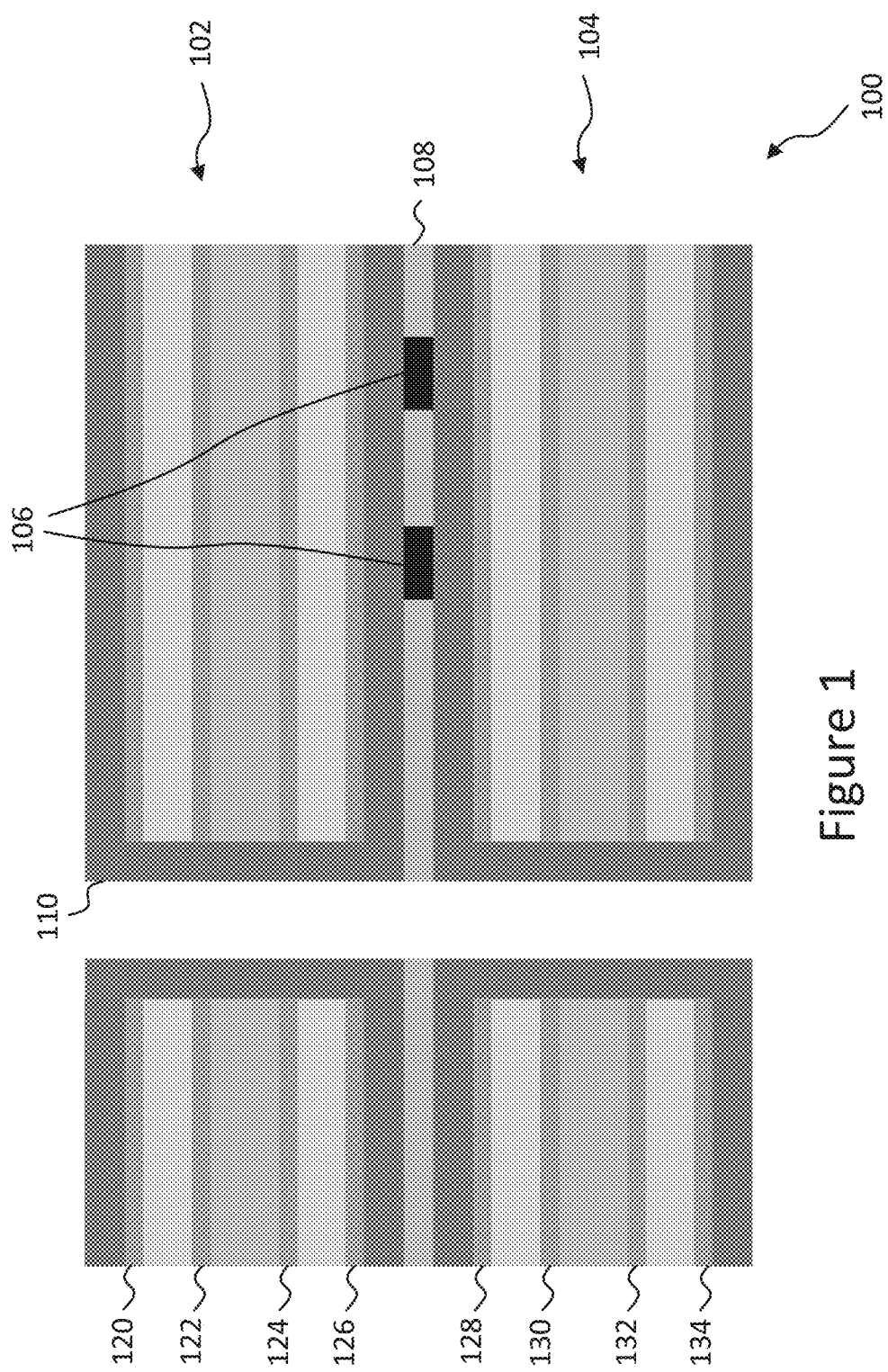
FIG. 1 is a cross-sectional view of a multi-layered printed circuit board with conductive paste connection.

Referring to FIG. 1, a cross section of an existing multi-layer PCB 100 with a conductive paste connection is shown. The PCB 100 includes a first core 102 and a second core 104 electrically connected by a conductive paste 106. The first core 102 includes a plurality of conductive layers 120, 122, 124, 126, typically comprising copper. Each conductive layer 120, 122, 124, 126 is patterned to form electrically conductive interconnects. Each conductive layer 120, 122, 124, 126 is separated by an insulating, or non-conductive layer. Likewise, the second core 104 also includes a plurality of conductive layers 128, 130, 132, 134 separated by an insulating or non-conductive layers. It is noted that the number of non-conductive layers and conductive layers shown in FIG. 1 is merely a design choice and that fewer or greater numbers of non-conductive layers and conductive layers can be used.

The first core 102 and the second core 104 are bonded together a prepreg layer 108. The opening 110 is also formed in the cores 102, 104. For pin insertion or component SMT, there must be a resin free opening 110. To create the opening 110 in sequential lamination, it is common to use pre-cut, low or no flow prepreg for prepreg layer 108. Using pre-cut, low or no flow prepreg, reduces the preperg resin that flows into the opening 110 during lamination. A low flow prepreg is used to describe a prepreg with lower resin flow than normal. Typically, low flow prepreg has resin flow less than 100 mil while regular flow is greater than 100 mil.

Figure 2:
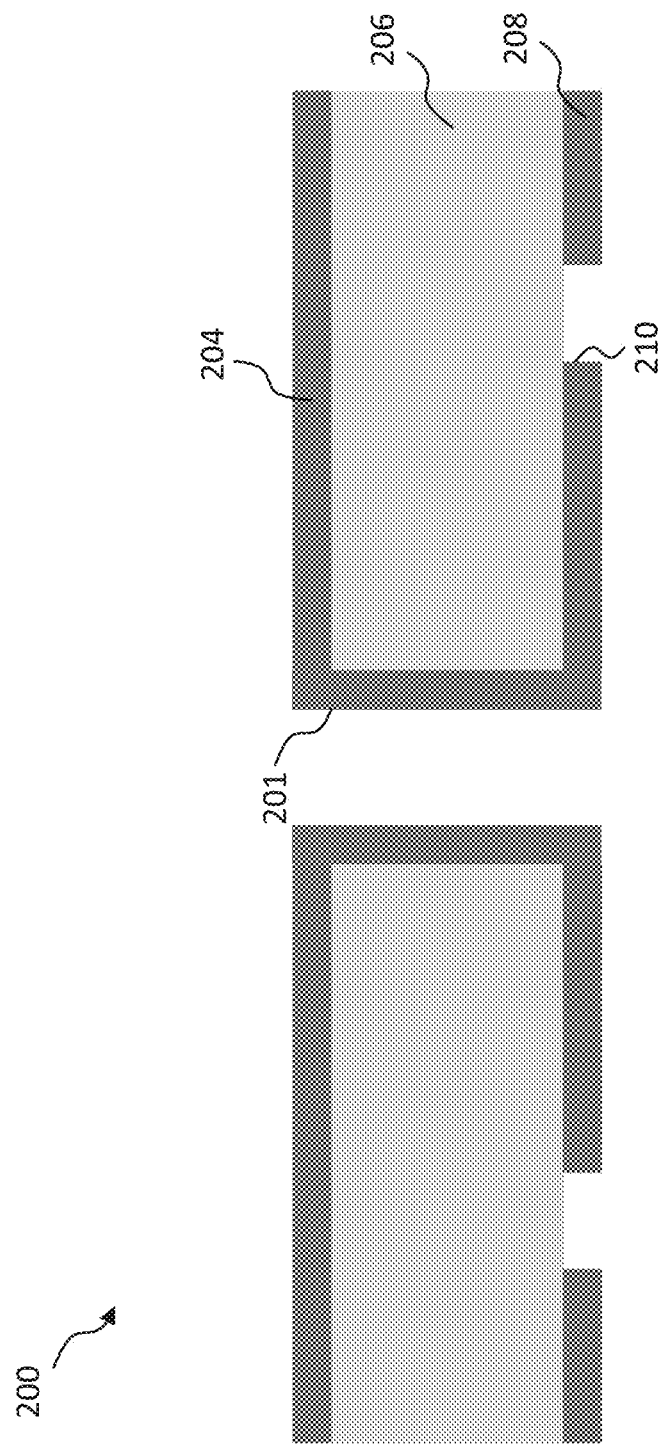
FIG. 2 is a cross-sectional view a first core of a printed circuit board during manufacturing, according to one example embodiment of the present invention.

Referring to FIG. 2, a cross section of a first PCB core 200 of a PCB is shown near a desired opening 201 in the PCB. A core is a one or more conductive layers separated by respective non-conductive layers. Each non-conductive layer in a core is made of a non-conductive base material. Base material and prepreg each include resin and glass cloth, but the resin in base material is already fully cured and as such does not flow during lamination.

The first core 200 is a metal clad base material where the base material has integral metal conductor material on one or both sides. The first core 200 includes a first copper conductive layer 204, a non-conductive layer 206, and a second copper conductive layer 208. The first core 200 also includes a first gap 210 in the second copper conductive layer 208. In other examples, the first core 200 includes more than two conductive layers separated by respective non-conductive layers.

Figure 3:
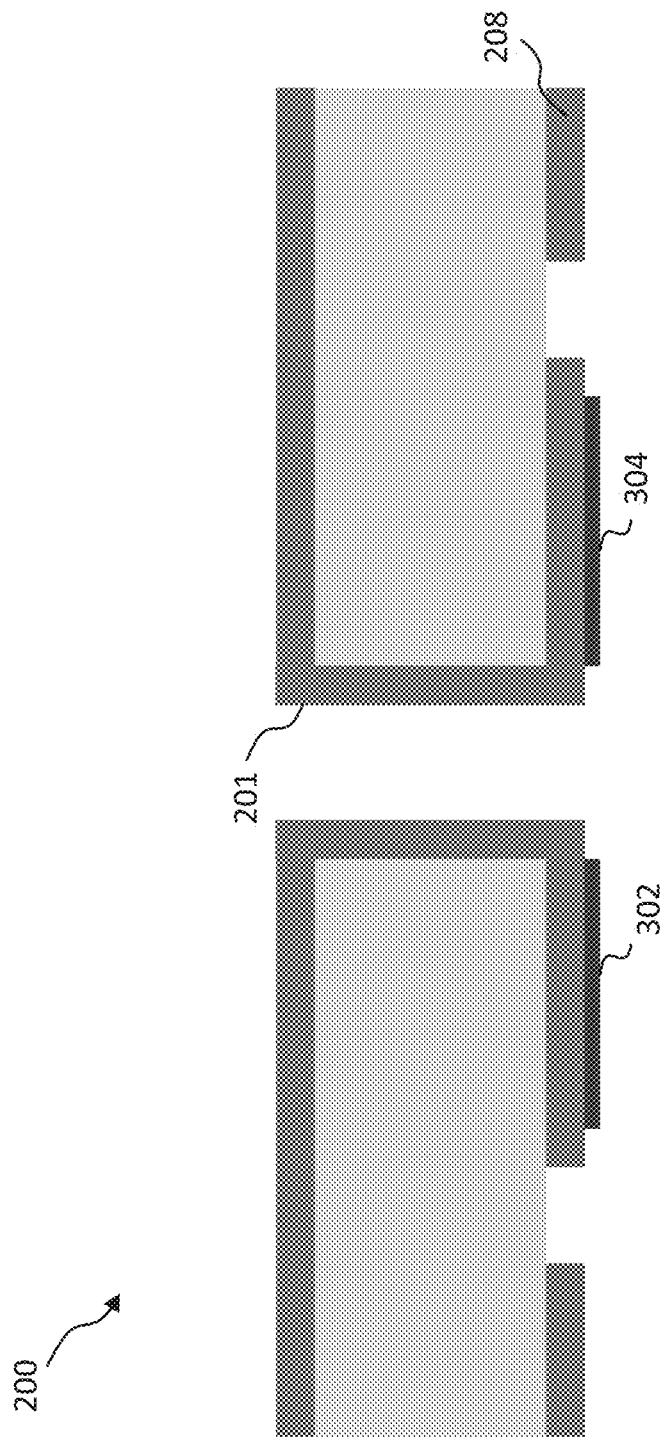
FIG. 3 is a cross-sectional view of the first core of FIG. 2 during manufacturing, according to one example embodiment of the present invention.

Referring to FIG. 3, the first core 200 is shown during the next step in manufacturing. A first and second SM 302, 304 is added to the second copper conductive layer 208 of the first core 200 near the opening 201. A SM is typically a thin, lacquer-like layer of polymer that is usually added to the copper traces of a PCB for protection against oxidation to reduce solder bridges from forming between closely spaced solder pads. The SM can also be used as a bonding layer.

Figure 4:
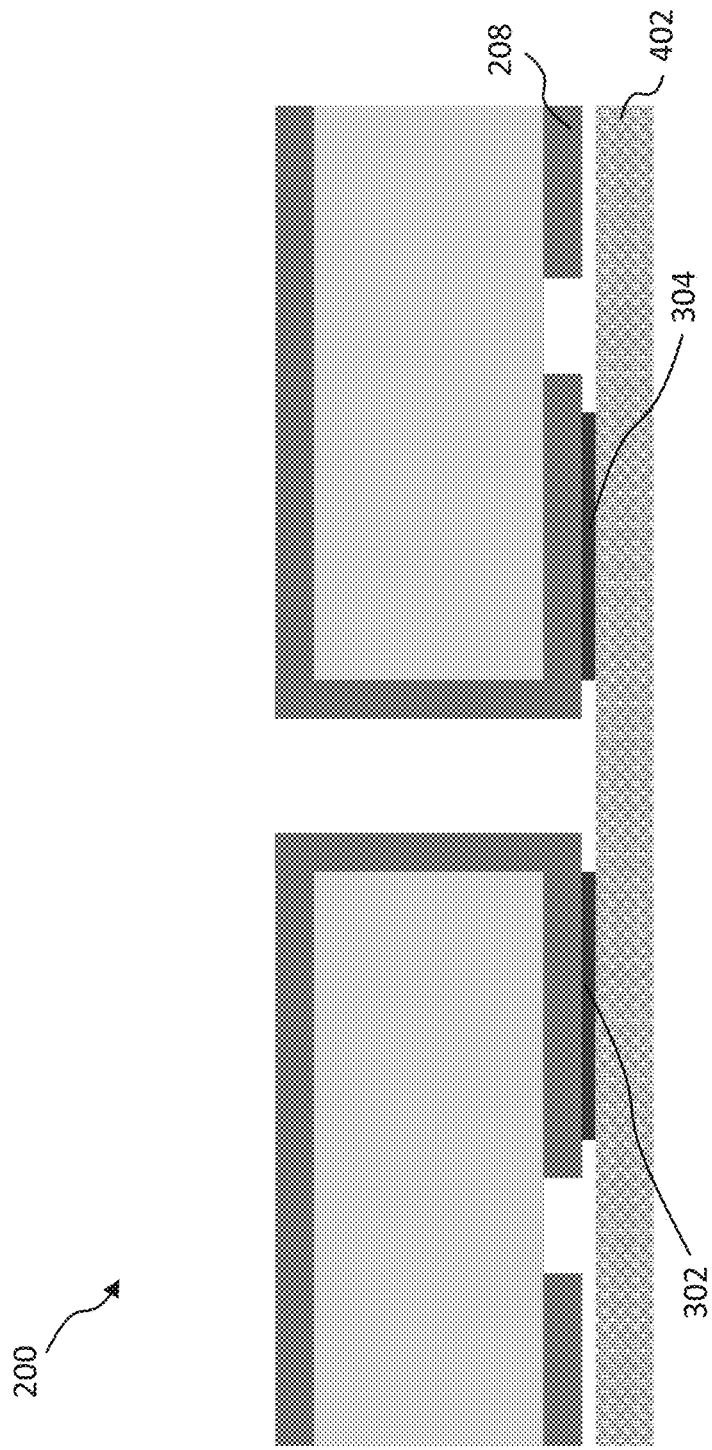
FIG. 4 is a cross-sectional view the first core of FIGS. 2 and 3 during manufacturing, according to one example embodiment of the present invention.
Figure 5:
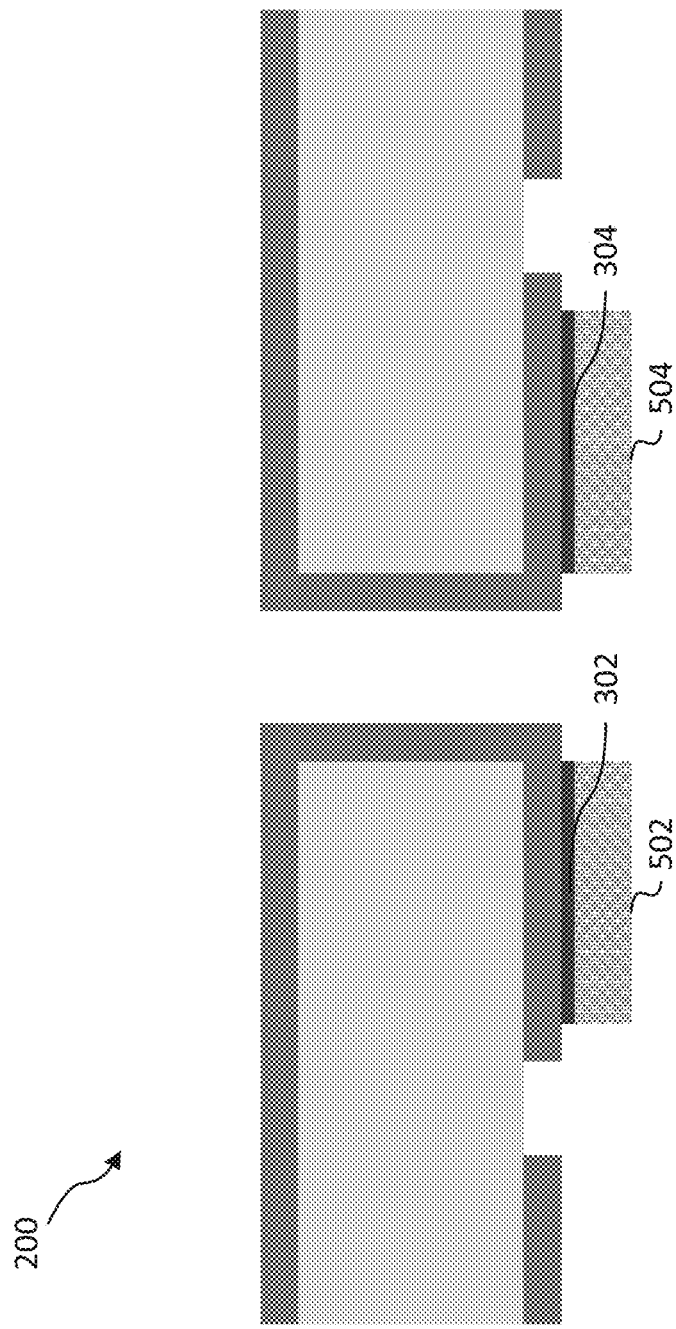
FIG. 5 is a cross-sectional view of the first core of FIGS. 2, 3, and 4 during manufacturing, according to one example embodiment of the present invention.

Referring to FIG. 4, the first core 200 is shown during the next step in manufacturing. A FR4 laminate 402 is fast laminated to the first and second SM 302, 304. In this case, the first and second SM 302, 304 is used as a bonding medium between the second copper conductive layer 208 and the FR4 laminate 402. Since the first and second SM 302, 304 is not final cured under the fast lamination pressure and temperature, the first and second SM 302, 304 strongly bond to the FR4 laminate 402. Next, the FR4 laminate 402 is laser cut to the desired configuration shown in FIG. 5, resulting in first and second FR4 laminates 502, 504 bonded to the first and second SM 302, 304, respectively.

Figure 6:
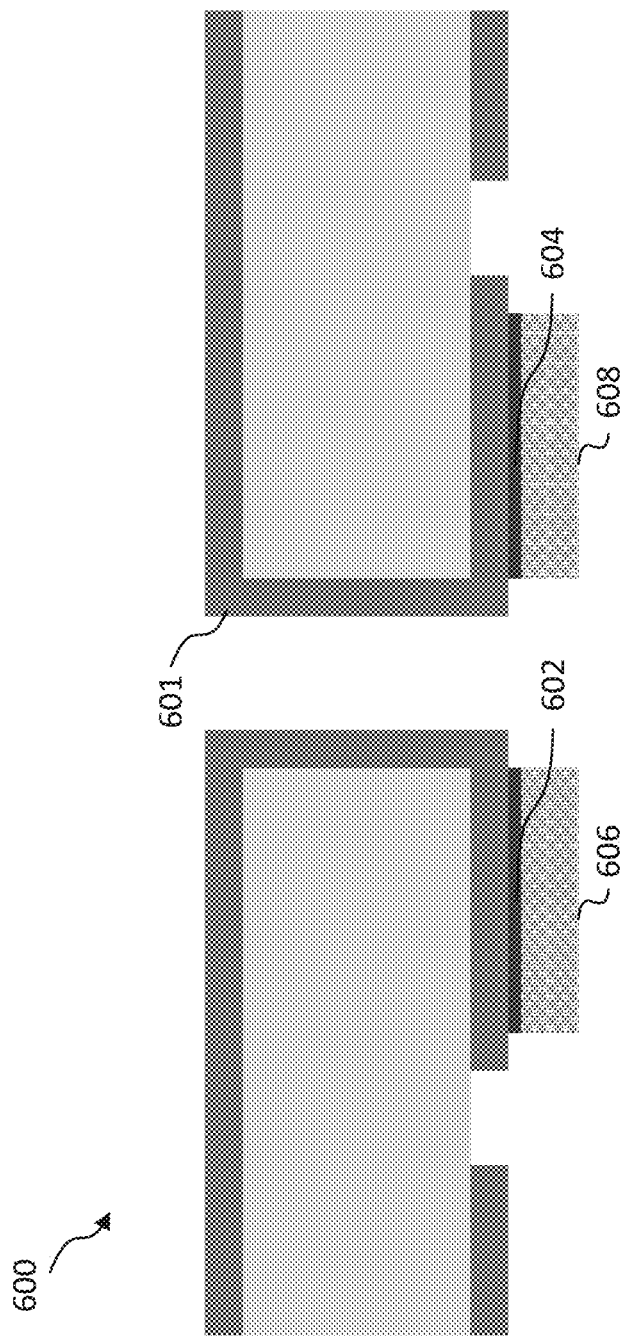
FIG. 6 is a cross-sectional view of a second core of a printed circuit board during manufacturing, according to one example embodiment of the present invention.

Referring to FIG. 6, a second core 600 of a PCB is shown. The second core 600 can also manufactured according to the process described in FIGS. 2-5 to have a resultant opening 601. As such, the second core 600 has first and second SM 602, 604. The second core 600 also has first and second FR4 laminates 606, 608 bonded to the first and second SM 602, 604. It is also noted that although in this example, the second core 600 mirrors the first core 200, it is not necessary that it be the same. The design will depend on the desired outcome.

Figure 7:
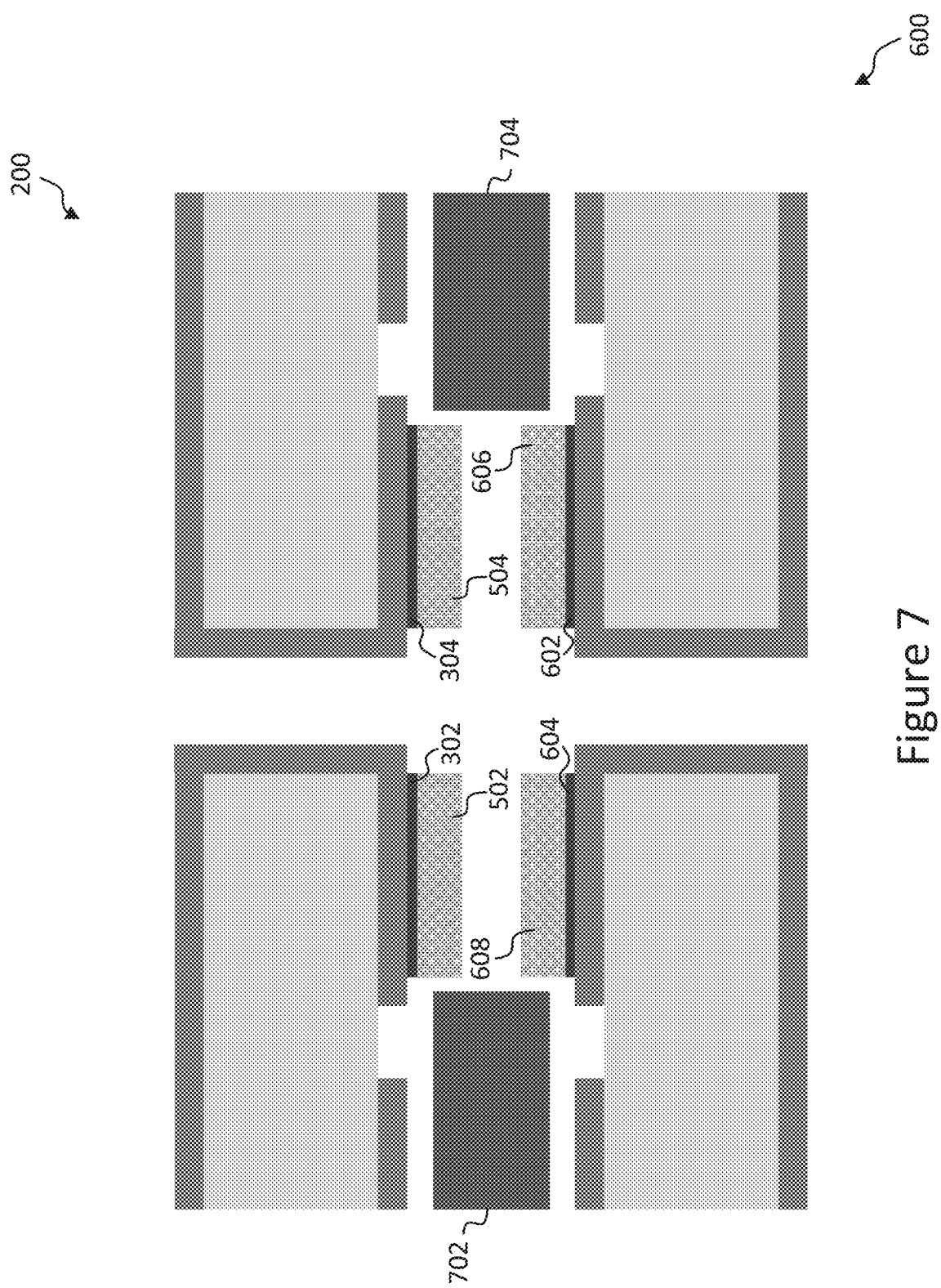
FIG. 7 is a cross-sectional view of the first core of FIGS. 2, 3, 4, and 5 and the second core of FIG. 6 during manufacturing, according to one example embodiment of the present invention.

Referring to FIG. 7, a next step in the manufacturing process is shown. The second core 600 is mated near the first core 200, such that the second core 600 mirrors the first core 200 with the respective FR4 laminates 502, 504, of the first core 200 contacting corresponding FR4 laminates 606, 608 on the other core. First and second bonding prepreg 702, 704 of desired thickness are pre-cut and placed between the first core 200 and the second core 600 as shown. Prepreg is used as an adhesive layer to bond discrete layers or cores during lamination. Prepreg is a fibrous reinforcement material impregnated or coated with a resin binder, and consolidated and partially cured to an intermediate stage semi-solid product. The resin in prepreg is only partially cured and therefore flows during lamination.

Figure 8:
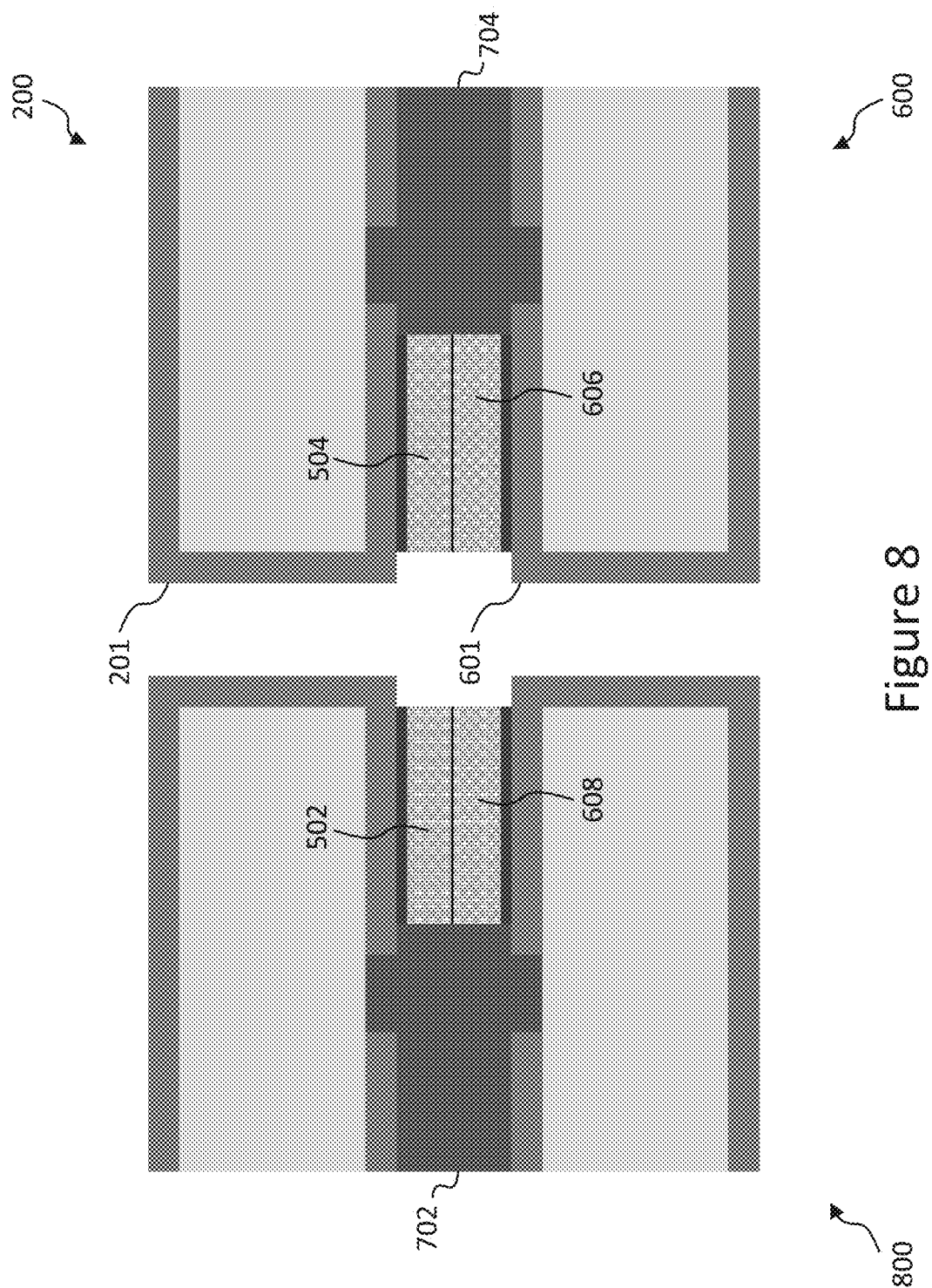
FIG. 8 is a cross-sectional view of the first and second core of FIG. 7 during manufacturing, according to one example embodiment of the present invention.

Next, the first core 200 and the second core 600 are laminated together under high pressure and pressed tightly together while the prepreg bonds the first and second cores 200, 600 together. Referring to FIG. 8, the resulting laminated stack PCB 800 comprising the first and second cores 200, 600 is shown after laminating them together as discussed in accordance with FIG. 7. The opening 201/601 has been preserved. The FR4 layers 502, 504, 608, 606 blocked the resin of prepreg 702, 704 from flowing into the opening 201/601 without limitation on the prepreg thickness, resin content and lamination setting. That is, because the FR4 laminates 502, 504, 606, 608 block the flow of the resin of prepreg 702, 704 into the opening 201/601, a regular flow prepreg can be used. Regular flow prepreg is less expensive than low or no flow prepreg and enables a regular pressure to be used during a subsequent lamination step.

Figure 9:
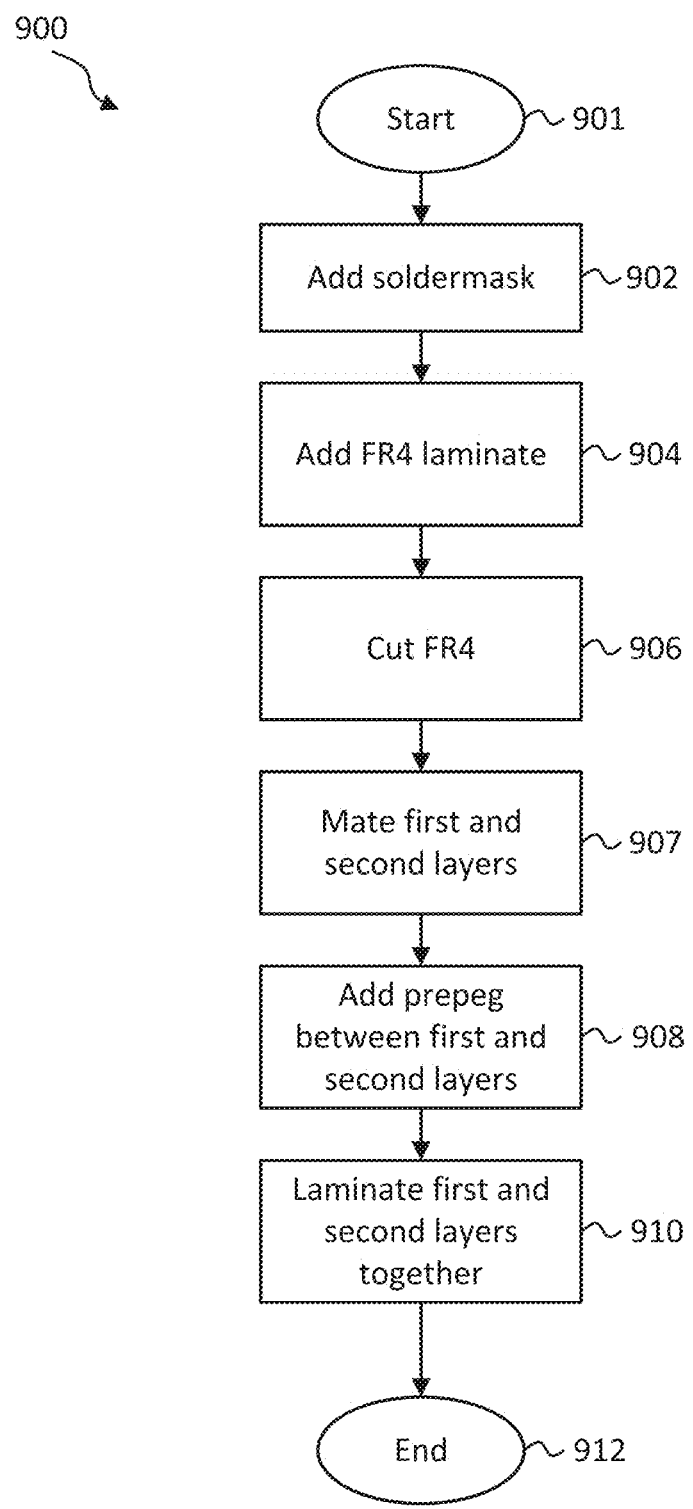
FIG. 9 is a flow diagram of a method of manufacturing a printed circuit board, according to one example embodiment of the present invention.

Referring to FIG. 9, a flow diagram of a method 900 of manufacturing a printed circuit board, such as PCB 800 of FIG. 8, is described. The method starts at 901. At 902, a solder mask is added to a first copper layer of a first core of a PCB having a first opening. At 904, a first FR4 laminate is bonded to the first solder mask. At 906, the first FR4 laminate is cut as desired. A second core having a second copper layer and a second opening can be manufactured according to steps 902, 904, and 906 resulting in a second FR4 laminate and a second solder mask. At 907, the first and second cores are mated together for lamination such that the first FR4 laminate is opposite the second FR4 laminate and the first and second openings line up. At 908, prepreg is added between the first and second copper layers but not between the first and second FR4 laminates. At 910, the first and second cores are laminated together, wherein the first and second FR4 laminates reduces the prepreg resin flowing into the first and second openings. The method ends at 912.

Overall, the method described herein enables a PCB, such as that shown in FIG. 8, to be manufactured to preserve an opening without limitations on the prepreg layer. Because a FR4 laminate is bonded near the desired opening, the FR4 laminate blocks the prepreg resin from flowing into the opening during lamination. There is no limitations on the prepreg thickness, resin content and lamination setting. As such, standard prepreg can be used, which is less expensive and the manufacturing process is quicker.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

We claim:

1. A printed circuit board comprising:
   a first core having a first conductive layer, a first non-conductive layer, and a first copper layer;
   a second core having a second conductive layer, a second non-conductive layer, a second copper layer;
   an opening disposed through the first core and the second core for insertion of a pin or component surface mount technology;
   FR4 laminate disposed between the first core and the second core and adjacent to the opening, the FR4 laminate bonded to a first solder mask on the first copper layer and a second solder mask on the second copper layer; and
   a prepreg layer disposed between the first core and the second core and blocked from the opening by the FR4 laminate.

2. The printed circuit board of claim 1, wherein the first copper layer has a first gap.

3. The printed circuit board of claim 2, wherein the second copper layer has a second gap.

4. The printed circuit board of claim 3, wherein the prepreg layer fills the first and second gap.

5. The printed circuit board of claim 1, wherein the first opening is plated with copper to connect the first conductive layer and the first copper layer.

6. The printed circuit board of claim 5, wherein the second opening is plated with copper to connect the second conductive layer and the second copper layer.

7. The printed circuit board of claim 1, wherein the first core includes a third conductive layer and a third non-conductive layer.

8. The printed circuit board of claim 1, wherein the first solder mask is near the first opening but not at the first opening and the second solder mask is near the second opening but not at the second opening.

9. A method of manufacturing a printed circuit board, the method comprising:
   adding a first solder mask to a first copper layer of a first core having a first opening;
   bonding a first FR4 laminate to the first solder mask;
   adding a second solder mask to a second copper layer of a second core having a second opening;
   bonding a second FR4 laminate to the second solder mask;
   aligning the first core to the second core such that the first FR4 laminate is opposite the second FR4 laminate and the first opening and the second opening line up to form a combined opening for insertion of a pin or component surface mount technology;
   adding a prepreg resin between the first copper layer and the second copper layer but not between the first FR4 laminate and the second FR4 laminate; and
   laminating the first core to the second core, wherein the first FR4 laminate and the second FR4 laminate reduce the prepreg resin flowing into the combined opening.

10. The method of claim 9, further comprising cutting the first FR4 laminate prior to aligning the first core to the second core.

11. The method of claim 10, further comprising cutting the second FR4 laminate prior to aligning the first core to the second core.

12. The method of claim 11, wherein cutting the first FR4 laminate includes cutting the first FR4 laminate to the same width as the first solder mask.

13. The method of claim 12, wherein cutting the second FR4 laminate includes cu ting the second FR4 laminate to the same width as the second solder mask.

14. The method of claim 9, wherein bonding a first FR4 laminate includes bonding a pre-cut FR4 laminate to the first solder mask.

15. The method of claim 9, wherein bonding a second FR4 laminate includes bonding a pre-cut FR4 laminate to the second solder mask.

16. The method of claim 9, wherein laminating the first core to the second core includes using a pre-cut bonding prepreg.

17. The method of claim 9, wherein adding a first solder mask includes adding a first solder mask near the first opening but not at the first opening.

18. The method of claim 17, wherein adding a second solder mask includes adding a second solder mask near the second opening but not at the second opening.

19. The method of claim 9, wherein laminating includes the prepreg resin flowing into a first gap in the first copper layer.

20. The method of claim 19, wherein the laminating includes the prepreg resin flowing into a second gap in the second copper layer.

* * * * *